US007727588B2

(12) United States Patent
Moffat et al.

(10) Patent No.: US 7,727,588 B2
(45) Date of Patent: Jun. 1, 2010

(54) APPARATUS FOR THE EFFICIENT COATING OF SUBSTRATES

(75) Inventors: William A. Moffat, San Jose, CA (US); Craig Walter McCoy, San Jose, CA (US)

(73) Assignee: Yield Engineering Systems, Inc., Livermore, CA (US)

( * ) Notice: Subject to any disclaimer, the term of this patent is extended or adjusted under 35 U.S.C. 154(b) by 685 days.

(21) Appl. No.: 10/656,840

(22) Filed: Sep. 5, 2003

(65) Prior Publication Data

US 2005/0051086 A1 Mar. 10, 2005

(51) Int. Cl.
*C23C 16/00* (2006.01)
*C23C 16/06* (2006.01)

(52) U.S. Cl. ............................. 427/248.1; 427/255.28; 427/255.31

(58) Field of Classification Search ............. 427/248.1, 427/255.28, 255.31
See application file for complete search history.

(56) References Cited

U.S. PATENT DOCUMENTS 5,252,134 A * 10/1993 Stauffer ...................... 118/726
5,665,639 A * 9/1997 Seppala et al. ................ 438/15
5,943,550 A * 8/1999 Fulford et al. ................ 438/14
6,136,725 A * 10/2000 Loan et al. .................. 438/758
6,214,729 B1 * 4/2001 Uhlenbrock et al. ........ 438/681
6,240,874 B1 * 6/2001 Pike ........................... 118/666

FOREIGN PATENT DOCUMENTS

GB 2107360 A * 4/1983
JP 04154953 A * 5/1992

OTHER PUBLICATIONS

Bunshah et al. "Deposition Technologies for Films and Coatings: Developments and Applications" 1982, Noyes Publications, Park Ridge, NJ, p339.*

* cited by examiner

*Primary Examiner*—Timothy Meeks
*Assistant Examiner*—Kelly M Gambetta
(74) *Attorney, Agent, or Firm*—Michael A. Guth

(57) ABSTRACT

A process for the coating of substrates comprising insertion of a substrate into a process oven, dehydration of the substrate, withdrawal of a metered amount of one or more chemicals from one or more chemical reservoirs, vaporizing the withdrawn chemicals in one or more vapor chambers, and transfer of the vaporized chemicals into a process oven, thereby reacting with the substrate. An apparatus for the coating of substrates comprising a process oven, a metered chemical withdrawal subsystem, and a vaporization subsystem.

17 Claims, 11 Drawing Sheets

APPARATUS FOR THE EFFICIENT COATING OF SUBSTRATES

BACKGROUND

1. Field of the Invention

This invention relates to the coating of substrates, and in particular to an apparatus and process for the efficient coating of substrates using chemical vapor reaction.

2. Description of the Related Art

The application of coatings onto substrates and other workpieces is required as a process step in many industrial fields. An example of such a process is the coating of a silicon wafer with a layer of Hexamethyldisalizane (HMDS). This coating process is used to promote the adhesion of organic layers such as photoresist to the inorganic silicon wafer. The HMDS molecule has the ability to adhere to the silicon wafer and also to be adhered to by an organic additional layer. For example, silicon wafers would be baked for 30 minutes in a 150 C oven for 30 minutes to dehydrate them. The silicon wafers would then be sprayed with HMDS. The excess HMDS would then be spun off of the silicon wafer. A typical process of this type would result in a HMDS monolayer on the surface of the silicon wafer.

A problem encountered with the above mentioned process was that if the silicon wafer was not sufficiently dry prior to the application of HMDS, then residual moisture would interfere with the reaction of the HMDS to the silicon wafer. This would result in variations in the HMDS layer reaction and then could lead to voids in the subsequently applied next layer. Another problem with a process of this type is that HMDS would rapidly deteriorate when exposed to air and moisture, and thus such a process required a large amount of HMDS to provide a small amount of reaction.

Because of the problems relating to variations in the HMDS monolayer, processes for the coating of substrates with HMDS evolved. Later processes more thoroughly dehydrated the silicon wafer substrate prior to the application of HMDS, and limited the HMDS from much, if any, exposure to air and moisture. An example of such a process would be as follows. Silicon wafers would be placed in a vacuum chamber and cycled back and forth between vacuum and preheated hot dry nitrogen in order to dehydrate the silicon wafer. For example, the silicon wafer would be exposed to a vacuum of 10 Torr for 2 minutes. At this pressure water boils at about 11 C. The vacuum chamber would then be flooded with preheated nitrogen at 150 C. This part of the process would heat the surface of the silicon wafer so that the high temperature of the wafer would assist in the dehydration process as vacuum was once again applied. After 3 complete cycles, a vacuum of 1 Torr would be applied to complete the dehydration process.

The next step in such a process is to open a valve between the vacuum chamber and a canister of HMDS. At room temperature the HMDS boils at approximately 14 Torr and thus the chamber is flooded with 14 Torr of HMDS vapor. In this process the HMDS is not exposed to air or moisture and the silicon wafer is significantly dryer prior to being coated.

Some coating processes based on the above mentioned type of process require a higher pressure. The HMDS is preheated to create a higher vapor pressure. Typical figures are preheating of the HMDS to 100 C to produce up to 400 Torr pressure or HMDS vapor while limiting the pressure in the process oven at 300 Torr to avoid condensation of the HMDS.

Processes involving the preheating of the deposition chemicals have the drawback that if the deposition chemicals degrade with exposure to heat then the bulk preheating of these chemicals may result in the loss of the unused residual chemical. These chemicals are often very expensive. Also, many of these chemicals are hazardous materials. The less of these chemicals actually being used in the process at any time reduces the potential risk for processing facilities.

The coating of substrates for biotech applications may require sufficiently dehydrated substrates and insertion into the process chamber of one or more deposition chemicals which have been preheated and/or vaporized prior to insertion. Some coatings for biotech applications are quite expensive. Some coatings are difficult to vaporize and vaporization requires a combination of low pressure and high temperature. Without reduced pressure, the temperature required for vaporization may be too high to retain stability of the chemical to be vaporized. Biotech applications may require silane deposition onto glass and/or other substrates as a bridge to organic molecules. Among the silanes used are amino silanes, epoxy silanes, and mercapto silanes. These silanes are used in the adhesion layer between glass substrates and oligonucleotides. Oligonucleotides are a short DNA monomer. Substrates are coated with a monolayer of silane as a bridge between the inorganic substrate and the organic oligonucleotide. A silane coated substrate with an oligonucleotide layer is now a standard tool used in biotech test regimens. One area where this oligonucleotide layer is used is in the formation of DNA microarrays. A uniform and consistent silane layer leads to a more uniform and consistent top surface of the oligonucleotide layer, which in turn leads to more useful test results.

What is called for is a process and apparatus which withdraws deposition chemicals from a bulk storage container and then preheats and/or vaporizes this portion separately prior to delivery into the process chamber, allowing for the introduction of deposition chemicals at high temperatures and/or vapor pressures into a process chamber, without requiring preheating of bulk amounts of the deposition chemicals.

Substrates coated with such a process have more consistent monolayers with better bonds to the substrate, allowing for a more consistent oligonucleotide layer. This consistent substrate, used in DNA microarray tests, leads to more accurate test results

SUMMARY

A process for the coating of substrates comprising insertion of a substrate into a process oven, dehydration of the substrate, withdrawal of a metered amount of one or more chemicals from one or more chemical reservoirs, vaporizing the withdrawn chemicals in one or more vapor chambers, and transfer of the vaporized chemicals into a process oven, thereby coating the substrate. An apparatus for the coating of substrates comprising a process oven, a metered chemical withdrawal subsystem, a vacuum subsystem, and a vaporization subsystem.

DETAILED DESCRIPTION

Figure 1:
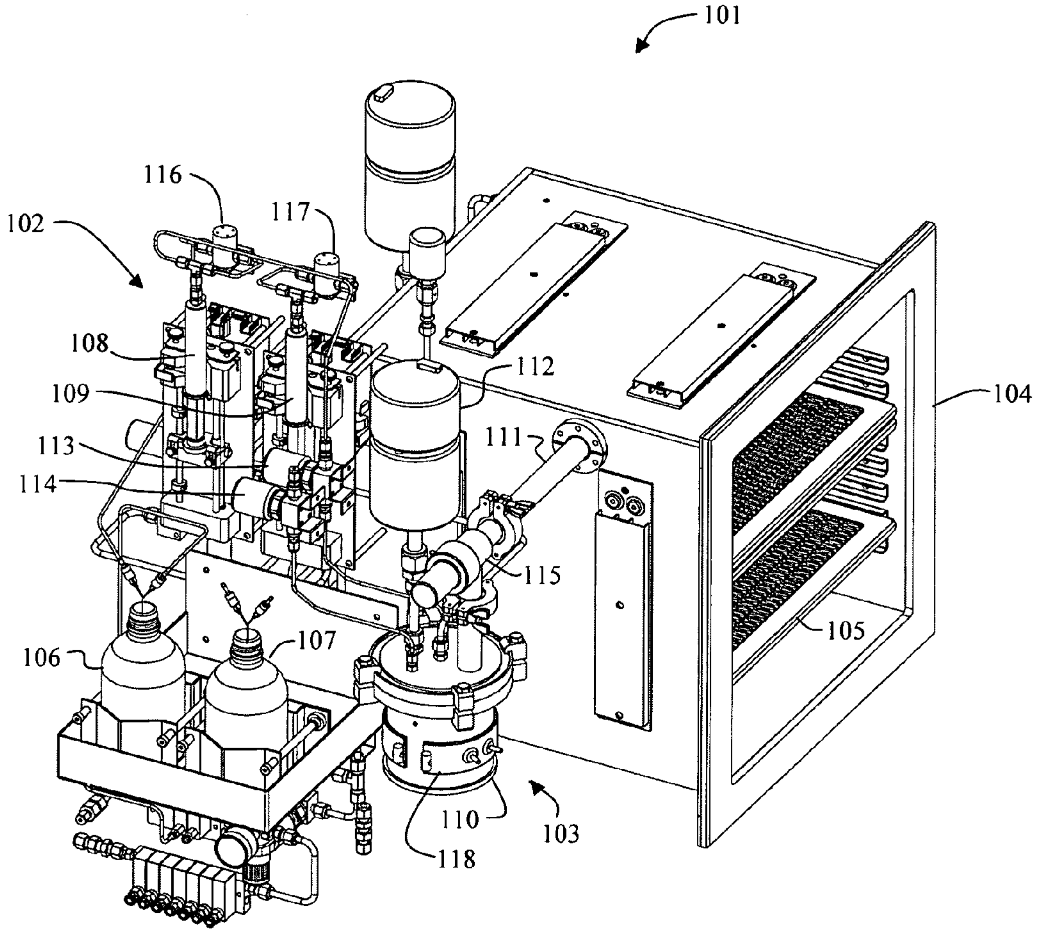
FIG. 1 is a pictorial representation of portions of one embodiment of the invention highlighting the chemical withdrawal, infuse, and vaporization subsystems.

In one embodiment of the present invention, as seen in FIG. 1, chemical vapor deposition apparatus 101 has a fluid input portion 102, a vaporization portion 103, and a process oven 104. Process oven 104 may be controlled with regard to both temperature and pressure. Fluid reservoirs 106, 107 provide the chemicals for the fluid input portion 102. Fluid reservoirs 106, 107, may be manufacturer's source bottles in some embodiments. Fluid reservoirs may contain the same fluid, allowing for the easy replacement of one reservoir if empty without disruption of the deposition process, or may contain separate chemicals. In some applications, water may be used as one of the chemicals in order to facilitate some rehydration of the substrate.

Chemicals in the fluid reservoirs 106, 107, are withdrawn into fluid input portion 102 by syringe pumps 108, 109. Although syringe pumps are used in this embodiment, other methods of withdrawal may be used, including peristaltic pumps and other appropriate methods. Chemical withdraw valves 116, 117, provide isolation between fluid reservoirs 106, 107, and syringe pumps 108, 109. Chemical withdraw valves 116, 117, are opened prior to withdrawal of chemicals from fluid reservoirs 106, 107.

Chemical infusion valves 113, 114 provide isolation between syringe pumps 108, 109, and the vapor chamber 110. The vapor chamber 110 is surrounded by vapor chamber heater 118. Although the vapor chamber heater is external to the vapor chamber in this embodiment, the vapor chamber heater may be internal to the vapor chamber or integral to the vapor chamber. The vapor chamber heater 110 may be P/N MBH00233 manufactured by Tempco, of Wood Dale, Ill., or other suitable heater. The vapor chamber 110 is fluidically coupled to process oven 104 by heated vapor line 111. The vapor chamber 110 may be isolated from process oven 104 by the operation of heated vapor valve 115. An example of such a heated vapor valve is valve P/N SS-8BK-VV-1C by Swagelok of Sunnyvale, Calif., with heater P/N 030630-41 by Nor-Cal Products of Yreka, Calif. The vapor chamber manometer 112 monitors the pressure inside vapor chamber 110. The process oven 104 may contain one or more trays 105.

Figure 2:
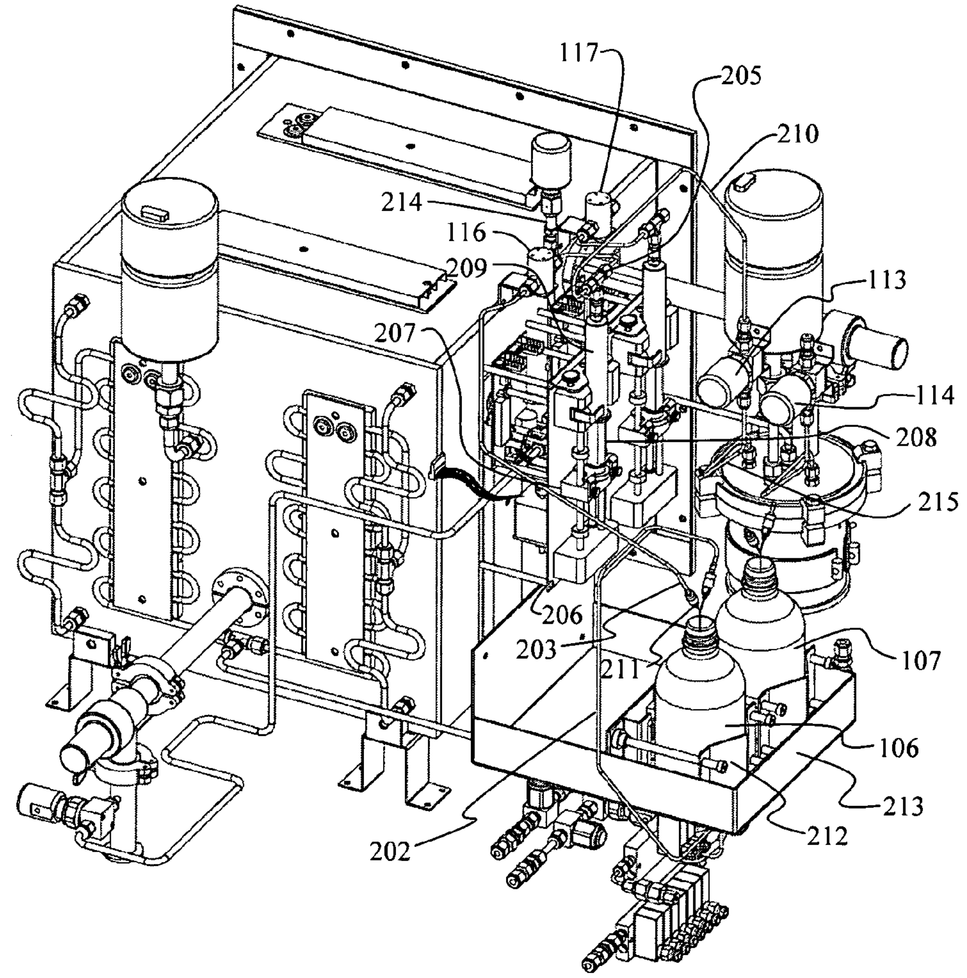
FIG. 2 is a pictorial representation of portions of one embodiment of the invention highlighting the chemical withdrawal and infuse subsystems.

In one embodiment of the present invention, as seen in FIG. 2, fluid input portion 102 routes chemicals from the fluid reservoir 106 through a delivery pipe 203 to the chemical withdraw valve 116. An example of such a chemical withdraw valve 116 is P/N 6LVV-DP11811-C manufactured by Swagelok of Sunnyvale, Calif. A fluidic coupler 211 is inserted into fluid reservoir 106 to allow fluid withdrawal from the fluid reservoir 106. In this embodiment, the fluid reservoirs 106, 107, are chemical source bottles. The fluidic coupler 211 also allows fluid such as dry nitrogen gas from pipe 202 to be inserted into the chemical reservoir 106 to fill the volume voided by the removal of chemical from the chemical reservoir 106. Exposure of the chemical to air and/or moisture is thus minimized. The syringe pump 206 may withdraw chemicals from fluid reservoir 106 when the chemical withdraw valve 116 is opened. An example of the syringe pump 206 is P/N 981948 manufactured by Harvard Apparatus, of Holliston, Mass. Actuation of the syringe pump mechanism 207 withdraws chemicals from the fluid reservoir 106 by partially or filly withdrawing the syringe plunger 208 from the syringe body 209. The amount of chemical withdrawn may be pre-determined, and also may be pre-determined with accuracy. The chemical is routed from the fluid reservoir 106, through the fluidic coupler 211 and the delivery pipe 203 to the chemical withdraw valve 116, through a pipe 214 and a T-coupler 205 to the syringe body 209 in this embodiment. In general, fluidic coupling can be referring to liquid or gas coupling in this embodiment.

After withdrawal of chemicals into the syringe body 209, the chemical withdraw valve 116 may be closed to isolate the delivery pipe 203. The chemical infusion valve 113 may then be opened to link the syringe body 209 to the vapor chamber 110. An example of such a chemical infusion valve 113 is P/N 6LVV-DP11811-C manufactured by Swagelok of Sunnyvale, Calif. The syringe pump mechanism 207 may then re-insert the syringe plunger 208 partially or fully into the syringe body 209, forcing the chemical within the syringe body 209 through the T-coupler 205 and then through pipe 210. With the chemical infusion valve 113 open, the chemical then may enter the vapor chamber 110 via pipe 215. Pressure within the vapor chamber 110 is monitored with the vapor chamber manometer 112. An example of such a manometer is a 0-100 Torr heated capacitance manometer P/N 631A12TBFP manufactured by MKS of Andover, Md.

The fluid reservoir 106 is secured with a spring clamp 212 within a source bottle tray 213. The source bottle tray 213 may also act as a spill containment vessel.

One of skill in the art will understand that the fluid input portion may have other embodiments that may use the above described elements in different types of combinations, or may use different typed of elements.

Figure 3:
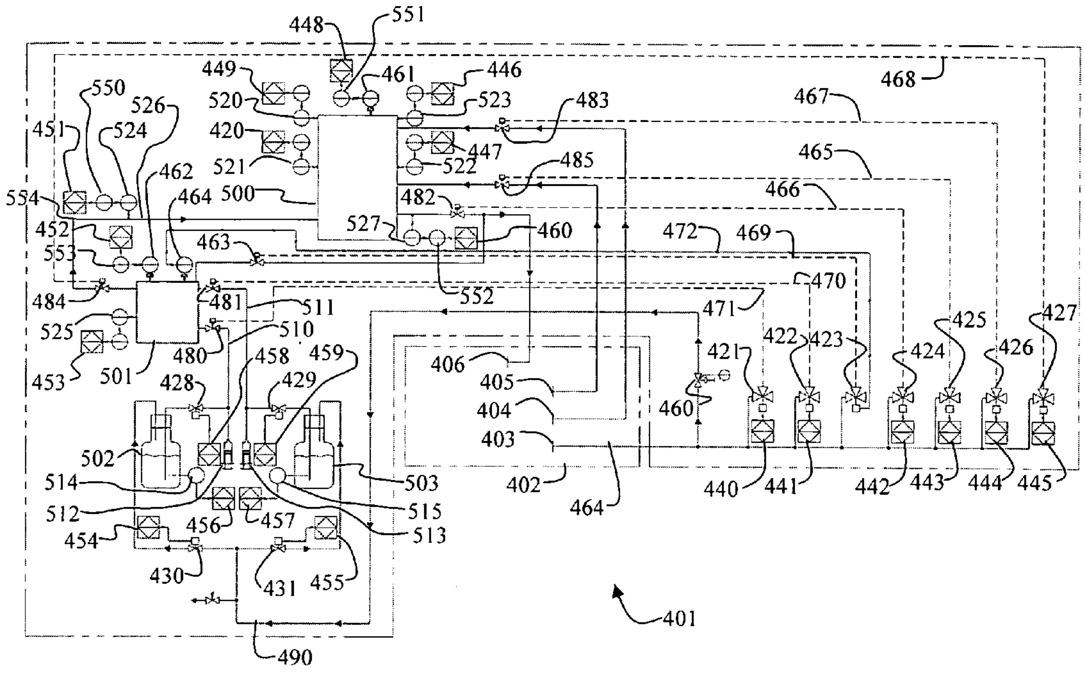
FIG. 3 is a representational piping schematic of one embodiment of the present invention.

In one embodiment of the present invention, as seen in FIG. 3, piping and other hardware is arranged as illustrated in the piping schematic 401. Vacuum and gas portion 402 illustrates the portion of the apparatus with inputs for gas and the provision of vacuum. In one embodiment of the present invention, a high pressure gas inlet 403 connects to 80-100 psig nitrogen, an inlet 404 connects to 5-15 psig of a process gas, and an inlet 405 connects to 15-40 psig nitrogen. A vacuum inlet 406 provides vacuum to the system.

The high pressure gas inlet 403 provides gas via a line 464 to the chemical reservoirs 502, 503, and also provides the pressure to actuate valves 463 and valves 480-484. Solenoids 421-427 are directed by a logic controller at I/O locations 440-445 to actuate valves 480-485 using solenoids 421-427. The gas from the high pressure gas inlet 403 is reduced in pressure to 4 psig by a pressure reducer 460 to be fed to the chemical reservoirs.

The solenoid acutated valves 430, 431 are triggered by directions from a logic controller at I/O interfaces 454, 455 to allow for purging of the chemical source bottle feed line 490.

When the solenoid 421 is directed by the logic controller via the I/O interface 440, high pressure gas is directed through a line 471 to actuate the chemical infusion valve 480, which connects the fluid line 510 from the syringe pump 512 to the vaporization chamber 501. When the solenoid 422 is directed by the logic controller via the I/O interface 441, high pressure gas is directed through the line 470 to actuate the chemical infusion valve 481, which connects the fluid line 511 from the syringe pump 513 to the vapor chamber 501.

When the solenoid 426 is directed by the logic controller via the I/O interface 444, high pressure gas is directed through the line 467 to actuate valve 483 which allows for the introduction into the process chamber 500 of gas from the inlet 404. When the solenoid 425 is directed by the logic controller via the I/O interface 443, high pressure gas is directed through the line 465 to actuate the valve 485, which allows for the introduction into the process chamber 500 of gas from the inlet 405.

When the solenoid 427 is directed by the logic controller via the I/O interface 445, high pressure gas is directed through a line 468 to actuate the heated vapor valve 484, which allows for the introduction into the process chamber 500 of vaporized chemical from the vapor chamber 501 via line 554. Temperature indicating controller 524 and temperature alarm high switch are coupled to I/O interface 451.

Solenoid operated valves 428, 429 allow the opening and closing of lines between the chemical reservoirs 502, 503 and the syringe pumps 512, 513. I/O interfaces 458, 459 control the operation of the solenoid operated valves 428, 429.

The level of chemical left in the chemical reservoirs 502, 503 is monitored with level sensors 514, 515 and routed to the logic controller via the I/O interfaces 456, 457. Level sensors 514, 515 are capacitance level switches P/N KN5105 by IFM Effector of Exton, Pa., in this embodiment.

The vapor chamber pressure switch 464 is linked directly by a line 472 to a solenoid actuated valve 423, which, when triggered, in turn triggers the gas actuated overpressurization limit relief valve 463. The overpressurization limit relief valve 463 connects the vapor chamber 501 to the vacuum line inlet 406. The vapor chamber pressure switch 464 triggers when the pressure in the vapor chamber 501 exceeds a preset pressure, which is 650 Torr in this embodiment.

The process oven manometer 461 feeds its signal to the logic controller via an analog interface (not shown). Overtemperature alarm 551 feeds its signal to the logic controller via I/O interface 448. An I/O interface 442 controls the solenoid actuated valve 424, which in turn can trigger the gas actuated heated vacuum valve 482 via a line 466, which links the process oven 500 to the vacuum inlet 406. A temperature monitor 527 monitors the vacuum line temperature and is linked to the logic controller via an I/O interface 460. Temperature alarm high switch 552 is linked to the logic controller via an I/O interface 460.

Temperature monitors 520, 521, 522, 523 monitor the temperature in the process oven 500. Temperature monitors 520, 521, 522, 523 are linked to the logic controller by an RS-485 interface (not shown). Alarms are present in the temperature monitoring system and are linked to the logic controller by I/O interfaces 446, 447, 449, 450.

Temperature monitors 524, 525 connected to I/O interfaces 451, 453 are also used to monitor the temperature of the heated vapor line 526 and the vapor chamber 501. A pressure monitor 462 is linked to the logic controller by an analog interface and overtemperature alarm 553 is linked to the logic controller by an I/O interface 452.

A logic controller may be used to control this apparatus in some embodiments. An example of such a controller is Control Technology Corporation Model 2700 of Hopinkton, Mass. One of skill in the art will understand that the apparatus may be controlled using a variety of suitable methods.

Figure 4:
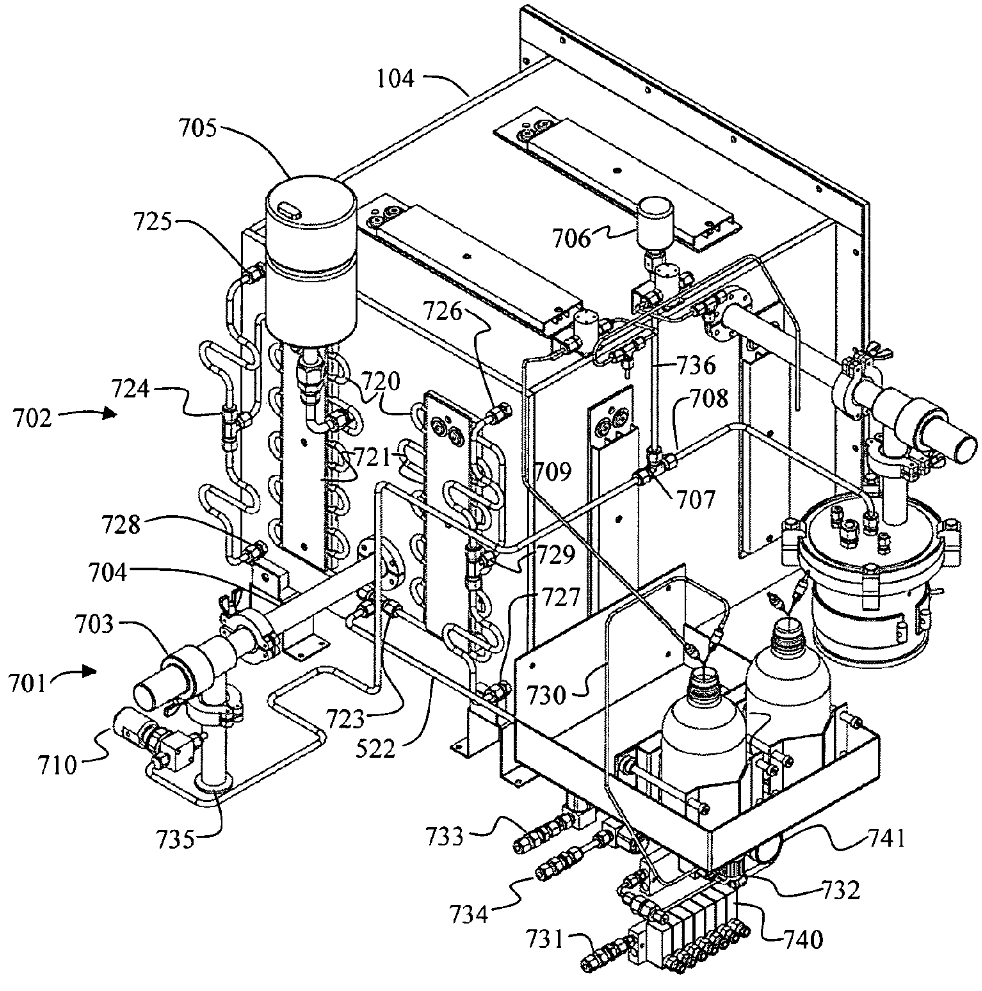
FIG. 4 is a pictorial representation of portions of one embodiment of the present invention highlighting the vacuum and gas delivery subsystems.

In one embodiment of the present invention, as seen in FIG. 4, a chemical vapor deposition apparatus 101 has a vacuum subsystem 701. Vacuum is applied to the vacuum subsystem 701 vacuum input supply line 735. A heated vacuum valve 703 may be actuated to isolate the heated vacuum line 704 from the vacuum input supply line 735. An example of the heated vacuum valve is P/N SS-8BK-VV-1C manufactured by Swagelok of Sunnyvale, Calif. The vacuum in the process chamber is measured using the chamber manometer 705. An example of such a manometer is P/N 631A13TBFP manufacture by MKS of Andover, Md. Vacuum input supply line is fluidically coupled to the overpressurization limit relief valve 710. An example of such a overpressurization limit relief valve is P/N SS-BNVS4-C manufactured by Swagelok of Sunnyvale, Calif. Overpressurization limit relief valve 710 couples vacuum input supply line 735 to line 709. T-coupler 707 links line 708, line 709, and line 736. Line 736 is fluidically coupled to vapor flask overpressurization limit switch 706. The overpressurization limit switch 706 is electrically connected to a solenoid actuated valve which supplies high pressure gas that actuates the overpressurization limit relief valve 710. An example of the vapor flask overpressurization limit switch is P/N 51A13TCA2AF650 by MKS of Andover, Md. Line 708 is fluidically coupled to vapor chamber 110.

A low pressure gas distribution manifold 733 distributes gas such as dry nitrogen for use in dehydration cycles. Inert gas such as dry nitrogen may be used in these lines. A purge manifold 732 allows for the purging of the fluid reservoirs and lines. The low pressure gas input line 522 is split at a T-coupler 723 into two serpentine lines 720. Gas line heaters 721 allow for the pre-heating of the gas prior to delivery of the process chamber. T-couplers 724, 729 further divide the delivery lines prior to input to the chamber at the gas inlets 725, 726, 727, 728.

A high pressure gas distribution manifold 731 provides gas for purge manifold 732 which inserts low pressure nitrogen into the fluid reservoirs 106, 107. A line 730 routes gas to a fluidic coupler 211 in order to replace the volume voided by chemical withdrawal. Inert gas such as dry nitrogen may be used in these lines. The regulator 741 reduces the pressure from manifold 731 upstream from purge manifold 732.

High pressure gas distribution manifold 731 provides high pressure gas that is routed to the gas actuated valves by the triggering of solenoid actuated valves in valve bank 740.

An alternative process gas distribution inlet 734 provides another inlet for process gas that may be used in some processes using this embodiment of the present invention. In this embodiment, the process gas lines are fluidically coupled to the low pressure gas lines upstream of the serpentine lines 720.

Figure 5:
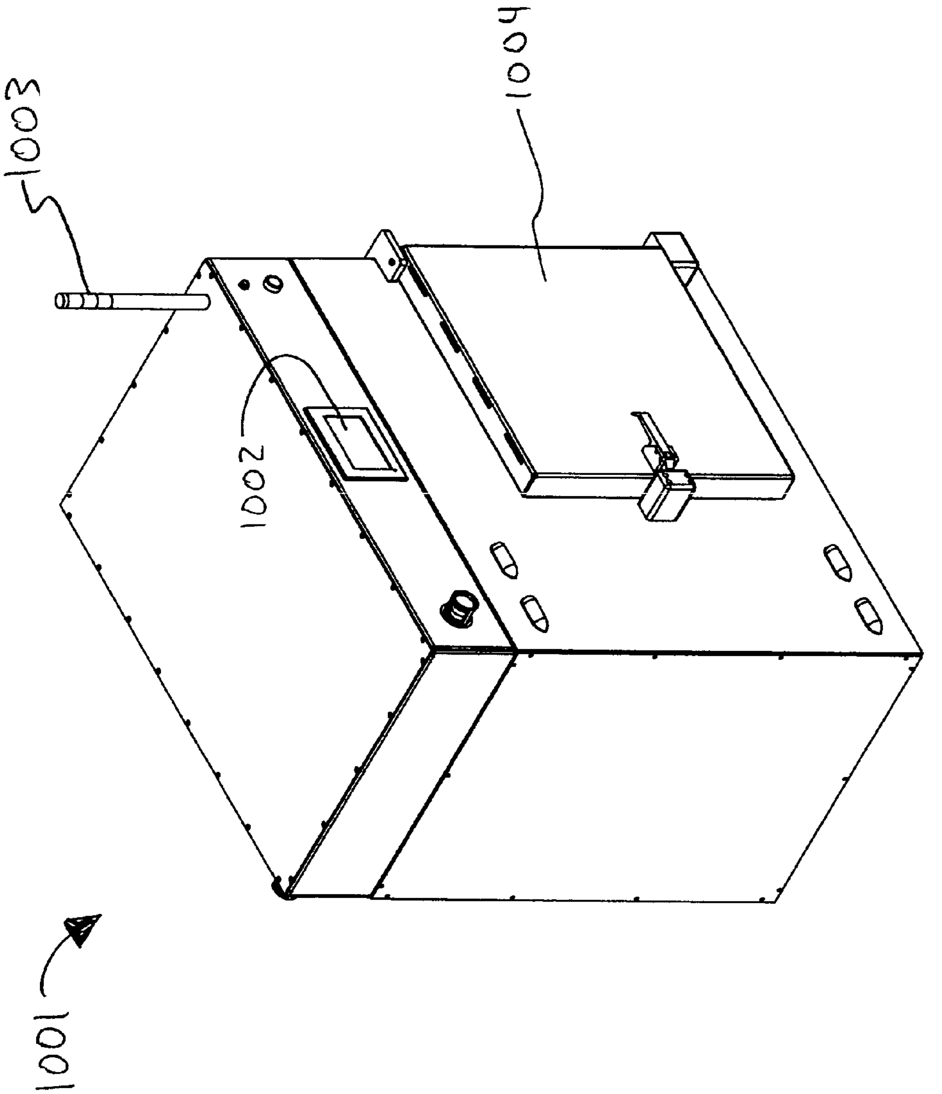
FIG. 5 is a front isometric view of one embodiment of the present invention.

As seen in FIG. 5, chemical vapor reaction apparatus 1001 has a touchpanel interface 1002. The light tower 1003 signals status of the apparatus to persons in the vicinity. Door 1004 provides access to the process chamber.

Figure 6:
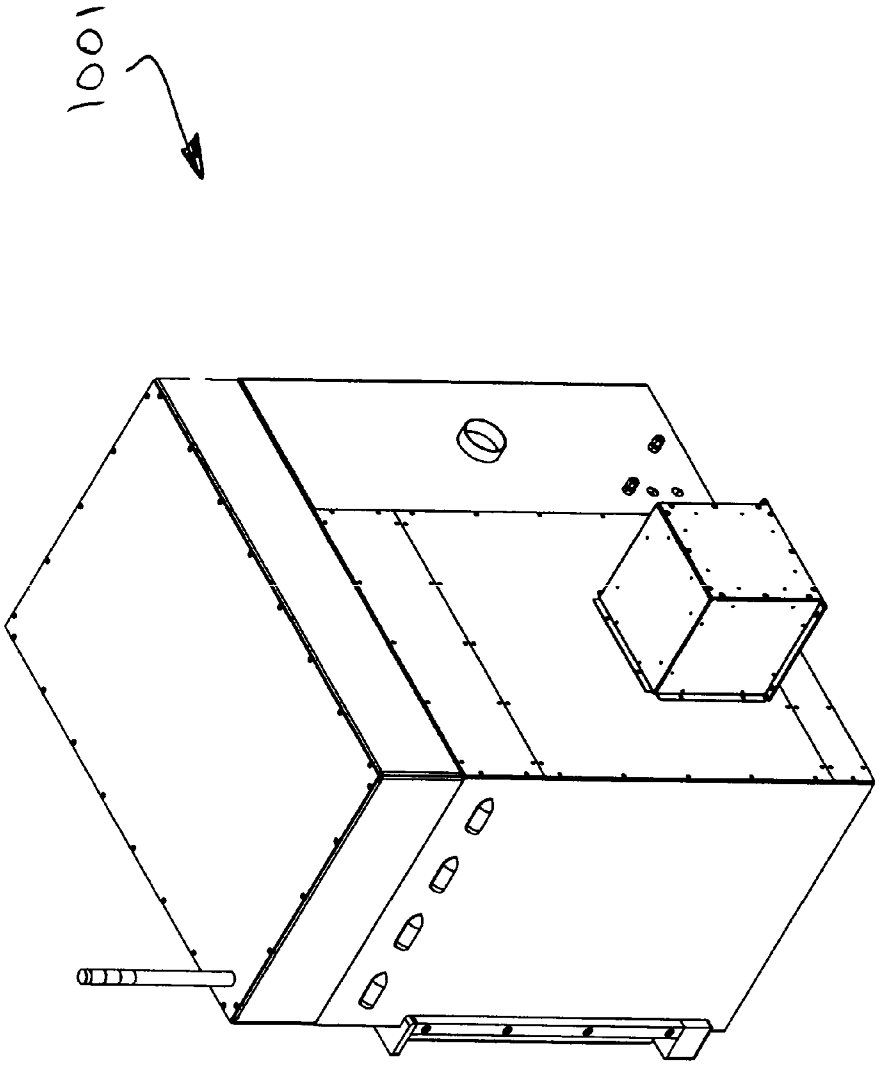
FIG. 6 is a rear isometric view of one embodiment of the present invention.
Figure 8:
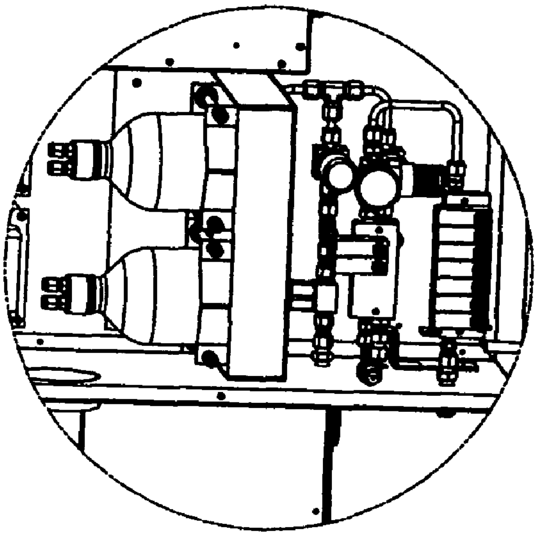
FIG. 8 is a blown up section of the partial side view of FIG. 7.
Figure 7:
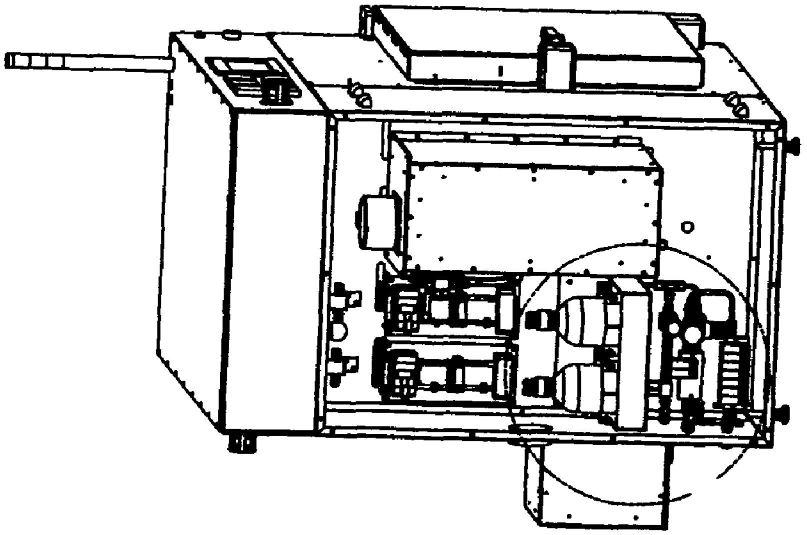
FIG. 7 is a partial cutaway side view of one embodiment of the present invention.
Figure 10:
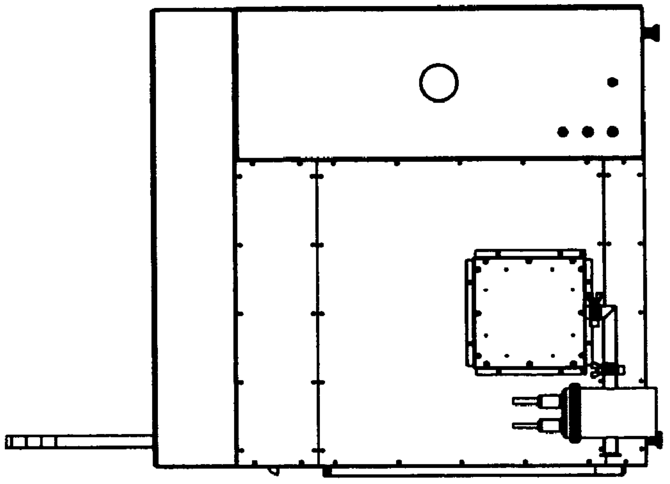
FIG. 10 is a rear view of one embodiment of the present invention.
Figure 9:
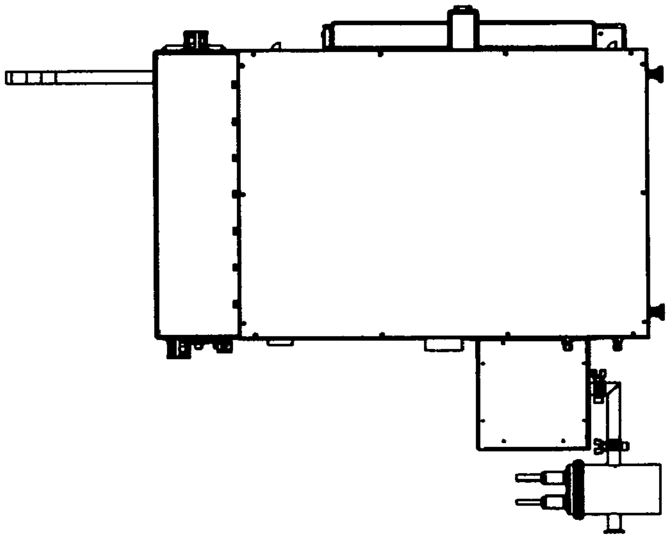
FIG. 9 is a side view of one embodiment of the present invention.
Figure 11:
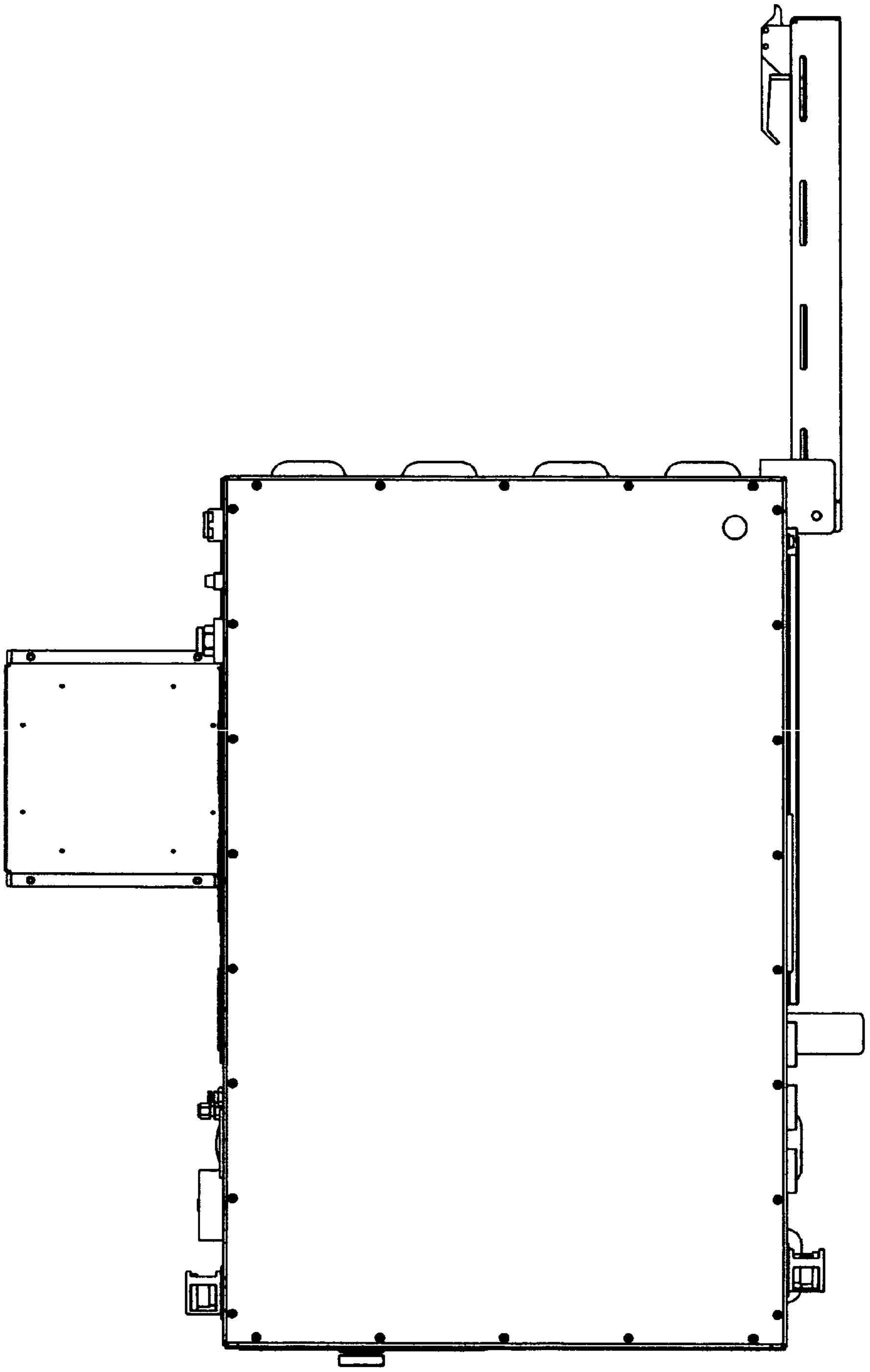
FIG. 11 is a top view of one embodiment of the present invention.
Figure 12:
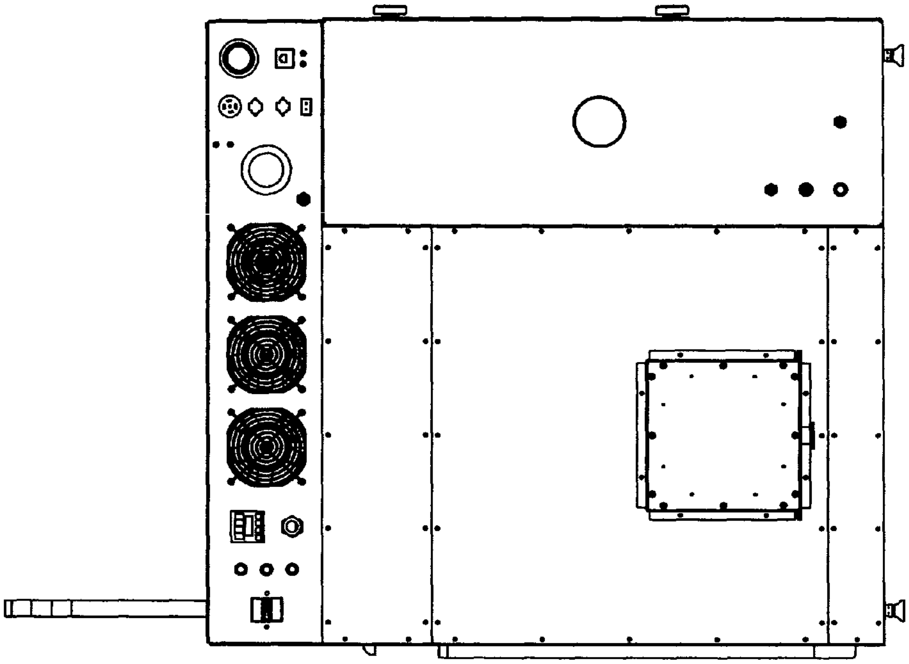
FIG. 12 is a rear view of one embodiment of the present invention.

FIG. 6 shows a rear isometric view of apparatus 1001. FIG. 7 is a partial cutaway side view of one embodiment of the present invention. FIG. 8 is a blown up section of the partial side view of FIG. 7. FIG. 9 is a side view of one embodiment of the present invention. FIG. 10 is a rear view of one embodiment of the present invention. FIG. 11 is a top view of one embodiment of the present invention with the process door open. FIG. 12 is a rear view of one embodiment of the present invention.

Figure 13:
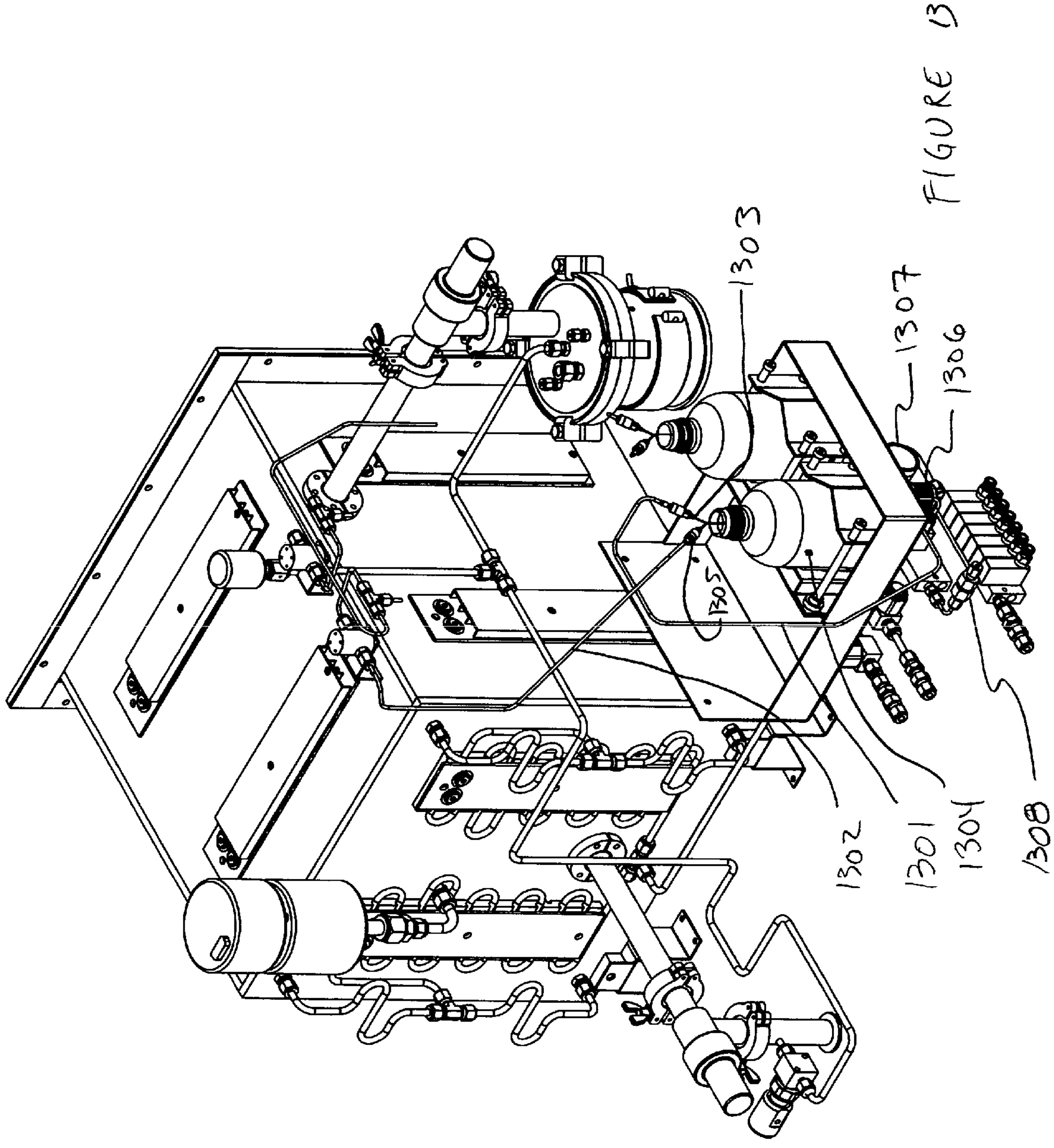
FIG. 13 is a partial cutaway view of one embodiment of the present invention.

FIG. 13 is a cutaway view of the vacuum subsystem and the chemical reservoir purge subsystem. A manufacturer's chemical source bottle 1304 is the chemical reservoir in this embodiment. The purge regulator 1307 feeds the purge manifold 1306 with a gas such as nitrogen. A 5 psi relief valve 1308 is located downstream from the purge manifold in this embodiment. Gas is routed to the bottle 1304 via a line 1301. Line 1301 connects to a fitting 1303 which routes the gas from line 1301 into the head portion of the source bottle 1304. The withdrawal line 1302 couple to the fitting 1305 for withdrawal of the chemical from the source bottle 1304. The tube supplying chemical to the withdrawal line 1302 terminates near the bottom of the inside of source bottle 1304. Line 1301 is delivered gas from the purge manifold 1306.

A process for the coating of substrates in a process chamber, which may include dehydrating the substrate, and vaporizing the chemical to be reacted prior to its entry into the process chamber.

A substrate for the chemical deposition of different chemicals may be of any of a variety of materials. For biotech applications, a glass substrate, or slide, is often used. Glass substrates may be borosilicate glass, sodalime glass, pure silica, or other types. Substrate dehydration may be performed as part of some processes. The glass slide is inserted into the process chamber. The slide is then dehydrated. Residual moisture interferes with the adhesion of chemicals during the deposition process. Alternatively, dehydration of the slide allows for later rehydration in a controlled fashion. The dehydration process alternates exposing the glass slide to vacuum and then to heated nitrogen, either once or multiple times. For example, the glass slide would be exposed to a vacuum of 10 Torr for 2 minutes. At this pressure water boils at about 11 C. The vacuum chamber would then be flooded with preheated nitrogen at 150 C. This part of the process would heat the surface of the glass slide so that the high temperature of the slide would assist in the dehydration process as vacuum was once again applied. After 3 complete cycles, a vacuum of 1 Torr would be applied to complete the dehydration process.

After the completion of the dehydration cycle, the slide is ready for chemical reaction. Chemical reservoirs, such as manufacturer's source bottles, provide the chemical for the deposition process. For many processes, silanes are used. Among the silanes used are amino silanes, epoxy silanes, and mercapto silanes. Chemical may be withdrawn directly from the reservoir. A metered amount of chemical is withdrawn from the chemical reservoir. This may be done by opening a valve between the chemical reservoir and a withdrawal mechanism. The withdrawal mechanism may be a syringe pump. Chemical is withdrawn from the reservoir, enters the syringe pump, and then the valve between the chemical reservoir and the syringe pump is closed. The chemical reservoirs may be purged with an inert gas such as nitrogen. This purging allows for the filling of the volume of fluid removed with an inert gas, minimizing contact between the chemical in the reservoir and any air or moisture.

Next, a valve between the syringe pump and a vaporization chamber is opened. The vapor chamber may be pre-heated. The vapor chamber may be a reduced pressure. The syringe pump then pumps the previously withdrawn chemical from the syringe pump to the vaporization chamber. The vapor chamber may be at the same vacuum level as the process oven. In parallel to this delivery of chemical to the vaporization chamber, a second chemical may be undergoing the same delivery process. The two chemicals may vaporize at substantially the same time. Additionally, more chemicals may also be delivered to the vaporization chamber, or to another vaporization chamber.

The reduced pressure in the vapor chamber, and/or the elevated temperature in the vapor chamber may allow for the vaporization of chemicals at pre-determined pressure levels and temperatures.

The vaporized chemical, or chemicals, are then delivered to the process chamber. This may be done by opening a valve between the vaporization chamber and the process oven after the chemical has vaporized in the vaporization chamber. Alternatively, the valve between the vaporization chamber and the process oven may already be open when the chemical, or chemicals, are delivered to the vaporization chamber. The chemical then proceeds into the process chamber and reacts with the substrate.

As evident from the above description, a wide variety of embodiments may be configured from the description given herein and additional advantages and modifications will readily occur to those skilled in the art. The invention in its broader aspects is, therefore, not limited to the specific details, representative apparatus and illustrative examples shown and described. Accordingly, departures from such details may be made without departing from the spirit or scope of the applicant's general invention.

We claim:

1. A process for coating of substrates comprising:

inserting a substrate into a process chamber;

dehydrating said substrate in the process chamber prior to reacting a silane with the substrate;

pre-heating a vaporization chamber to a first temperature with a vaporization chamber heater;

pre-determining a first volume of liquid silane to be used for the process;

removing the first volume of liquid silane from a silane liquid reservoir;

supplying the first volume of liquid silane to the heated vaporization chamber, wherein said heated vaporization chamber is fluidically coupled to said process chamber by a passageway open continuously while said first volume of liquid silane is supplied to said heated vaporization chamber;

vaporizing said first volume of liquid silane, wherein the vapor of said first volume of liquid silane enters said process chamber through the open passageway, whereby the vapor of said first volume of liquid silane reacts with the substrate to create a layer.

2. The process of claim 1, wherein said first liquid silane reservoir is a chemical manufacturer's source bottle.

3. The process of claim 1, wherein said dehydrating a substrate comprises:

inserting said substrate into said process chamber;

evacuating said chamber to a first pressure;

inputting a first gas into said process chamber after evacuating said chamber to a first pressure.

4. The process of claim 3 wherein said first gas is an inert gas.

5. The process of claim 4 wherein said inert gas is nitrogen.

6. The process of claim 3 wherein said first gas is heated.

7. The process of claim 3 further comprising re-evacuating said process chamber subsequent to said inputting a first gas into said process chamber.

8. The process of claim 7 wherein said re-evacuating said process chamber evacuates said process chamber to a second pressure.

9. The process of claim 8 wherein said second pressure is lower than said first pressure.

10. The process of claim 1 further comprising:

supplying a second chemical to a heated vaporization chamber;

vaporizing said second chemical; and supplying the vapor of said second chemical to said process chamber.

11. The process of claim 1 wherein said vaporizing said first volume of liquid silane occurs in a first vaporization chamber.

12. The process of claim 11 wherein said vaporizing said first volume of liquid silane comprises heating said first volume of liquid silane.

13. The process of claim 11 wherein said vaporizing said first volume of liquid silane comprises exposing said first volume of liquid silane to reduced pressure.

14. The process of claim 12 wherein said vaporizing said first volume of liquid silane further comprises exposing said first volume of liquid silane to reduced pressure.

15. The process of claim 10 wherein said vaporizing said first volume of liquid silane occurs in a first vaporization chamber.

16. The process of claim 15 wherein said vaporizing said second chemical occurs in said first vaporization chamber.

17. The process of claim 16 wherein said vaporizing said first volume of liquid silane and said vaporizing said second chemical occur relatively simultaneously.

* * * * *